(12) United States Patent
Lin

(10) Patent No.: US 11,314,410 B2
(45) Date of Patent: Apr. 26, 2022

(54) MOBILE DEVICE

(71) Applicant: ASUSTeK COMPUTER INC., Taipei (TW)

(72) Inventor: Po-Han Lin, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 19 days.

(21) Appl. No.: 16/422,560

(22) Filed: May 24, 2019

(65) Prior Publication Data

US 2019/0369863 A1    Dec. 5, 2019

Related U.S. Application Data

(60) Provisional application No. 62/677,253, filed on May 29, 2018.

(30) Foreign Application Priority Data

Feb. 12, 2019    (CN) .......................... 201910110855.2

(51) Int. Cl.
  *G06F 3/048* (2013.01)
  *G06F 3/01* (2006.01)
  *G06F 3/04883* (2022.01)
  *G06F 3/0482* (2013.01)
  *H05K 5/03* (2006.01)
  *G06F 1/16* (2006.01)
  *G06F 3/0486* (2013.01)

(52) U.S. Cl.
  CPC ........ *G06F 3/04883* (2013.01); *G06F 1/1694* (2013.01); *G06F 3/016* (2013.01); *G06F 3/0482* (2013.01); *G06F 3/0486* (2013.01); *H05K 5/03* (2013.01)

(58) Field of Classification Search
  CPC ..................................................... G06F 3/0482
  See application file for complete search history.

(56) References Cited

U.S. PATENT DOCUMENTS 7,084,859 B1 * 8/2006 Pryor ................. G01C 21/3664
                                                        345/156
7,148,875 B2 * 12/2006 Rosenberg ............ G06F 3/0416
                                                        345/156
7,307,622 B2 * 12/2007 Uchiyama ............... G06F 3/045
                                                        178/18.01

(Continued)

FOREIGN PATENT DOCUMENTS

CN      105320325 A     2/2016
TW      I397844         6/2013
TW      I397844 B1      6/2013

*Primary Examiner* — Nicholas Augustine
(74) *Attorney, Agent, or Firm* — McClure, Qualey & Rodack

(57) ABSTRACT

The disclosure provides a mobile device. The mobile device includes a housing, at least one motion sensor disposed on the housing, a touchscreen disposed in the housing, and a processor electrically connected to the motion sensor and the touchscreen. The processor establishes first connection setting information between at least one virtual button in an application displayed on the touchscreen and the motion sensor, and performs a function of the virtual button in response to sensing of the motion sensor according to the first connection setting information. Therefore, the mobile device provides a better experience for a user.

15 Claims, 6 Drawing Sheets

(56) References Cited

U.S. PATENT DOCUMENTS

| | | | |
|---|---|---|---|
| 9,787,890 B2* | 10/2017 | Cho | G06F 3/04845 |
| 10,831,246 B2* | 11/2020 | DeBates | G06F 1/1684 |
| 2011/0122085 A1 | 5/2011 | Chang | |
| 2012/0208639 A1* | 8/2012 | Reynolds | G06F 3/033 |
| | | | 463/36 |
| 2014/0247246 A1* | 9/2014 | Maus | G06F 3/0443 |
| | | | 345/174 |
| 2015/0103018 A1* | 4/2015 | Kamin-Lyndgaard | |
| | | | G06F 1/1626 |
| | | | 345/173 |
| 2016/0026381 A1* | 1/2016 | Kim | G06F 3/04886 |
| | | | 715/761 |
| 2017/0323279 A1* | 11/2017 | Dion | G06Q 30/0279 |

* cited by examiner

MOBILE DEVICE

CROSS-REFERENCE TO RELATED APPLICATION

This application claims the priority benefit of U.S. Provisional Application Ser. No. 62/677,253, filed on May 29, 2018. The entirety of the above-mentioned patent application is hereby incorporated by reference herein and made a part of the specification.

This application claims the priority benefit of Chinese Application Serial No. 201910110855.2, filed on Feb. 12, 2019. The entirety of the above-mentioned patent application is hereby incorporated by reference herein and made a part of specification.

BACKGROUND OF THE INVENTION

Field of the Invention

The invention relates to a mobile device.

Description of the Related Art

In a mobile device generally having a touch function, a touch operation is directly performed on a touchscreen. Taking the mobile phones with a gaming application program as an example, in the game, a user operates the function of the gaming application program by touching the virtual buttons of the gaming application program displayed on the touchscreen, so that an operated finger may block part of the touchscreen, and bad operation experience is caused.

BRIEF SUMMARY OF THE INVENTION

According to an aspect of the disclosure, a mobile device is provided herein. The mobile device comprises: a housing; at least one motion sensor, disposed on the housing; a touchscreen, disposed in the housing; and a processor, located in the housing and electrically connected with the motion sensor and the touchscreen, wherein the processor establishes first connection setting information between the motion sensor and at least one virtual button in at least one application program displayed on the touchscreen, and executes a function of the virtual button in response to sensing of the motion sensor according to the first connection setting information.

In summary, the mobile device of the disclosure has a hidden motion sensor connected to a virtual button of an application, and thus, the displaying surface of the touchscreen is not occupied or blocked. And, the motion sensors (shortcut keys) and the virtual buttons are provided for the user to increase the variety of operating selections. In addition, the shortcut keys provide a good operation feeling and a better operation experience for the user.

The detailed descriptions of other effects and embodiments of the disclosure are provided below with reference to the accompanying drawings.

BRIEF DESCRIPTION OF THE DRAWINGS

To more clearly describe the technical solutions in the embodiments of this application or in the prior art, the following will briefly introduce the accompanying drawings required for describing the embodiments or the prior art. It is apparent that the accompanying drawings in the following description are only some embodiments described in this application, and a person of ordinary skill in the art may obtain other accompanying drawings on the basis of these accompanying drawings without any creative effort.

DETAILED DESCRIPTION OF THE EMBODIMENTS

Figure 1:
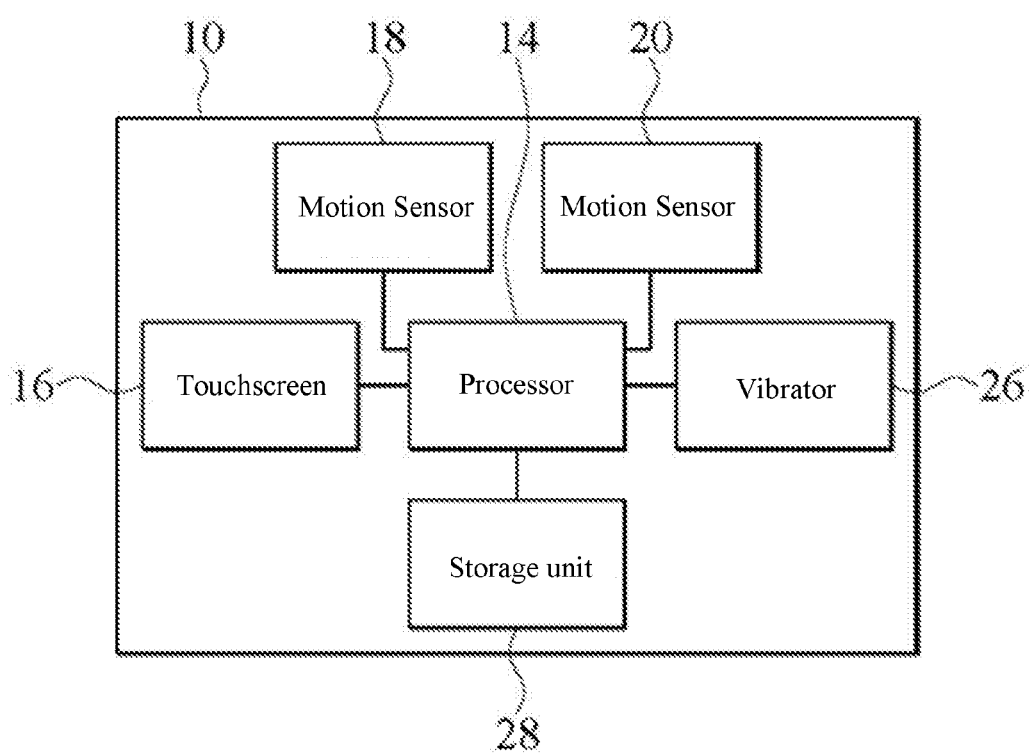
FIG. 1 is a circuit block diagram of a mobile device according to an embodiment of the disclosure.

The embodiments of the disclosure will be described in detail below by way of example and with reference to the accompanying drawings. In addition to these detailed descriptions, the disclosure can also be widely implemented in other embodiments, any replacement, modification, and equivalent change readily made to the embodiments are intended to be included within the scope of the disclosure as defined by the appended claims. In the specification, numerous specific details are set forth in order to provide a thorough understanding of the disclosure. However, the disclosure may be practiced without some or all of the specific details. In addition, well-known steps or components are not described in the embodiments to avoid unnecessarily limiting to the disclosure. The same or similar components in the drawings will be denoted by the same or similar symbols. It should be particularly noted that the drawings are for illustrative purposes only and are not intended to represent the actual size or number of components.

Figure 2:
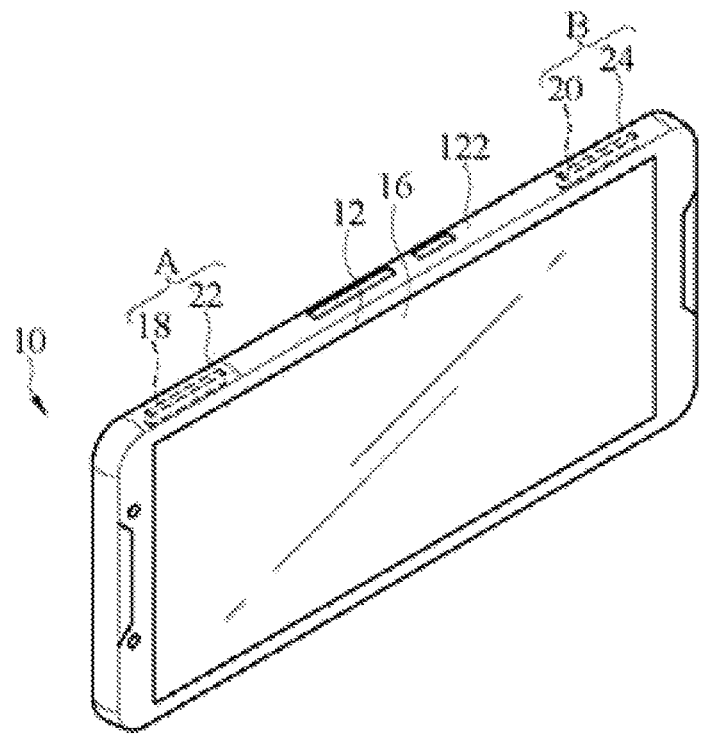
FIG. 2 is a schematic diagram of an appearance of a mobile device according to an embodiment of the disclosure.

FIG. 1 is a circuit block diagram of a mobile device according to an embodiment of the disclosure, and FIG. 2 is a schematic diagram of an appearance of a mobile device according to an embodiment of the disclosure. Referring to FIG. 1 and FIG. 2, the mobile device 10 includes a housing 12, a processor 14, a touchscreen 16, and two motion sensors 18 and 20. In an embodiment, the number of the motion sensor is two, but it is not limited thereto. In other embodiment, the number of the motion sensor is adjusted according to actual needs. In some embodiments, the mobile device 10 is but not limited to a mobile phone, a tablet computer or a personal digital assistant (PDA).

In an embodiment, the two motion sensors 18 and 20 are disposed on the housing 12, the processor 14 and the touchscreen 16 are disposed in the housing 12, and the touchscreen 16 is configured to display information such as a picture for user. The processor 14 is electrically connected with the touchscreen 16 and the motion sensors 18 and 20. In some embodiments, the motion sensors 18 and 20 are respectively disposed in the left side and the right sides on a long edge 122 of the frame 126 (shown in FIG. 10) of the housing 12. And the motion sensors 18 and 20 are embedded in the long edge 122 which are not exposed of the housing 12. Besides, prompt patterns 22 and 24 are respectively disposed on an outer surface, corresponding to the motion sensors 18 and 20, on the long edge 122 of the housing 12 to indicate the positions of the motion sensors 18 and 20. Thus the motion sensor 18 and the corresponding prompt pattern 22 are taken as a left shortcut key A and the motion sensor 20 and the corresponding prompt pattern 24 are taken as a right shortcut key B for operation more easy.

In some embodiments, the motion sensors 18 and 20 are at least one of a physical button, a capacitive pressure sensor, a resistive pressure sensor, or an ultrasonic sensor. In an embodiment, the motion sensors 18 and 20 are ultrasonic sensors, and the ultrasonic sensor determines whether an object touching the ultrasonic sensor is a human finger by sensing water content of the object. When the object is determined not a human finger, a corresponding operation function is not triggered, to avoid accidental touch. Therefore, even if an object other than a human finger accidentally touches the ultrasonic sensor, the ultrasonic sensor is not triggered. The ultrasonic sensor is triggered only when it is pressed or slid by a hand of human, thereby avoiding accidental touch.

Figure 3:
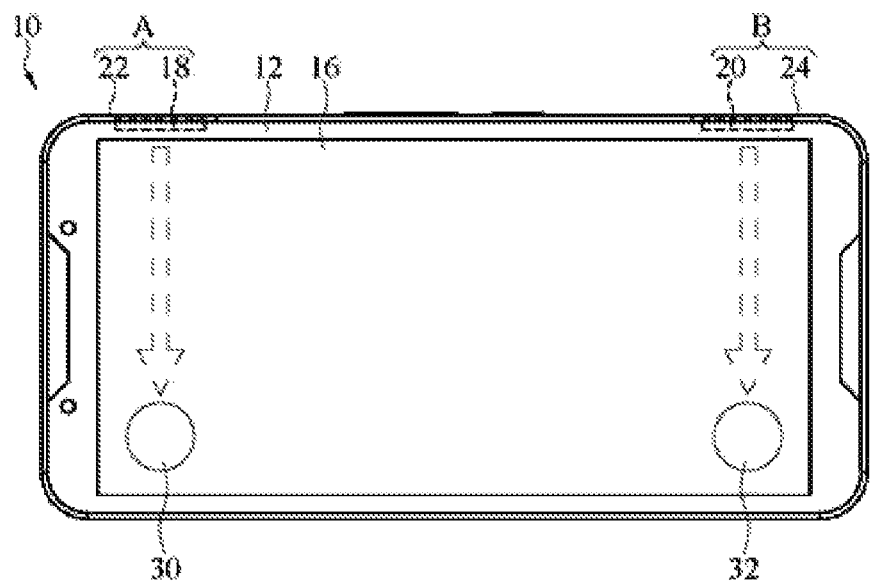
FIG. 3 is a schematic diagram of a mobile device when setting a virtual button according to an embodiment of the disclosure.
Figure 4:
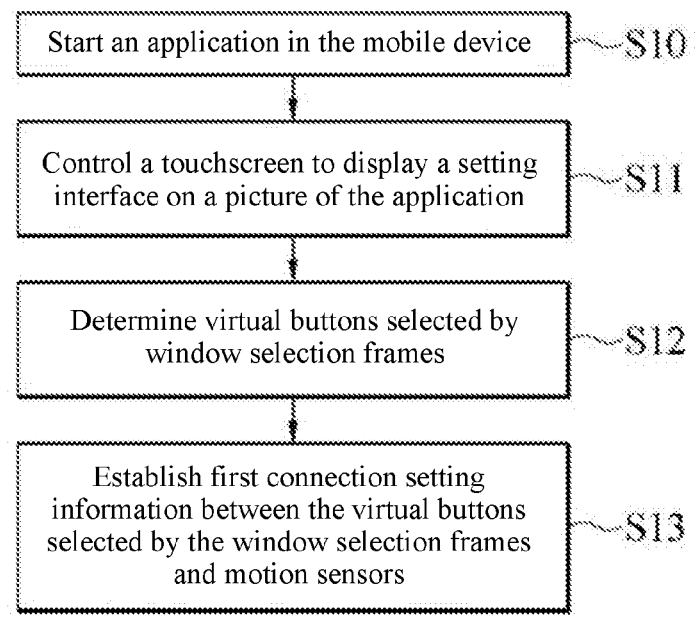
FIG. 4 is a schematic flowchart of setting a virtual button of a mobile device according to an embodiment.
Figure 5:
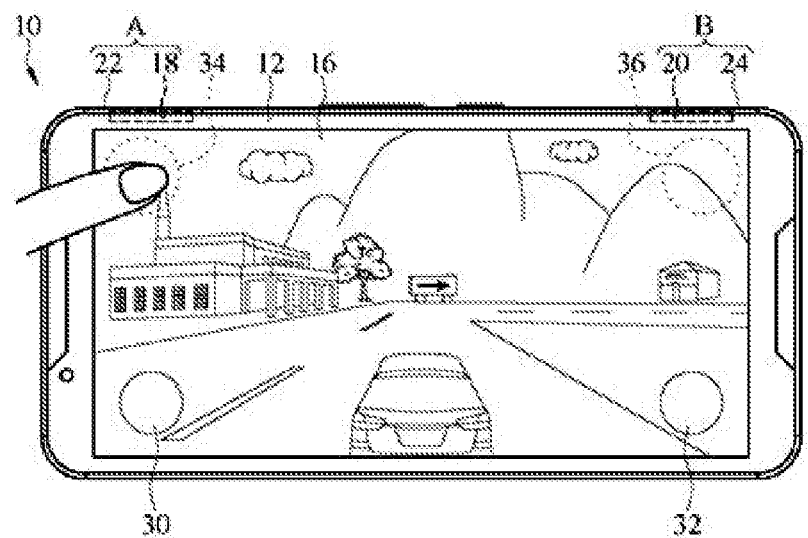
FIG. 5 is a schematic diagram of a mobile device when setting a virtual button according to an embodiment.

The mobile device 10 is configured to execute a plurality of application programs and provides a button setting process. In an embodiment, when the processor 14 executes one of the application programs, the touchscreen 16 displays the application execution picture, and the execution picture includes two virtual buttons 30 and 32, as shown in FIG. 3. The two virtual buttons 30 and 32 are taken for examples herein, but not limited to this number. In this case, the processor 14 establishes first connection setting information between the virtual buttons 30 and 32 and the corresponding motion sensors 18 and 20 by executing the button setting process, and the processor 14 performs functions of the virtual buttons 30 and 32 in response to sensing of the motion sensors 18 and 20 according to the first connection setting information. In some embodiments, the first connection setting information includes identifying code of the application program and position information (such as coordinate position) of the virtual buttons 30 and 32 of the application program displayed by on the touchscreen 16.

As shown in FIG. 1 to FIG. 3, the mobile device 10 further includes a vibrator 26 and a storage unit 28. The processor 14 is electrically connected with the vibrator 26 and the storage unit 28.

The vibrator 26 generates a vibration according to an action of the motion sensors 18 and 20. In an embodiment, when the prompt pattern 24 is pressed, the motion sensor 20 corresponding to the prompt pattern 24 senses the press motion to generate a sensing signal and transmits the sensing signal to the processor 14. Thus, the processor 14 triggers the virtual button 32 to perform a corresponding function of the application program according to the first connection setting information, and the processor 14 further drives the vibrator 26 to generate a vibration according to the sensing signal to feedback the pressing operation, for providing an interaction environment. In some embodiments, the vibrator 26 is a vibrator built in the mobile device 10.

In an embodiment, the storage unit 28 stores the aforementioned application program, the button setting process, the first connection setting information of between the virtual buttons 30 and 32 and the motion sensors 18 and 20. Different applications have different connection setting information, so that the processor 14 stores these application programs and the first connection setting information corresponding to these application programs by the storage unit 28. In some embodiments, the storage unit 28 is separately disposed from the processor 14 or is built into the processor 14, depending on user requirements or an actual circuit design.

In the mobile device, the user operates according to an instruction of a setting interface of the button setting process to trigger the processor to establish the first connection setting information between the motion sensor and the virtual button of the application. Please refer to FIG. 2, in the embodiment, the left shortcut key A includes the motion sensor 18 and the prompt pattern 22, and the right shortcut key B includes the motion sensor 20 and the prompt pattern 24. The following is a detailed description of the button setting process about the left shortcut key A and the right shortcut key B.

Figure 6:
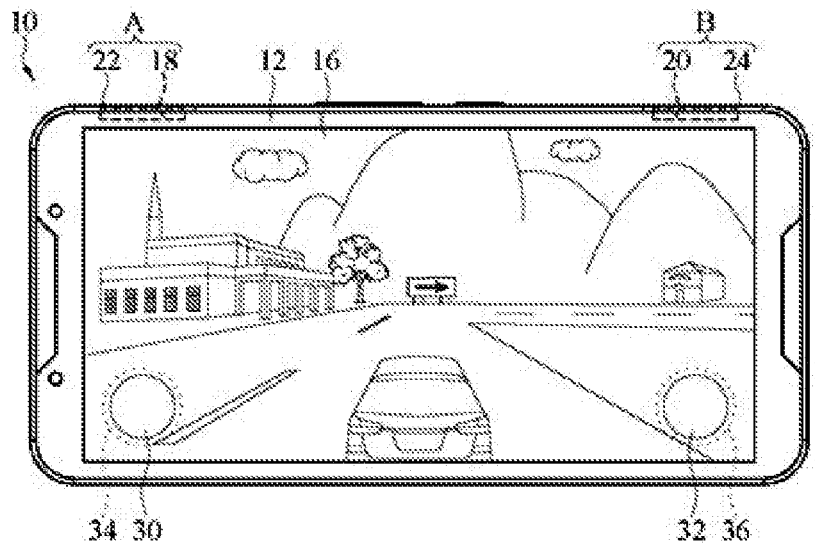
FIG. 6 is a schematic diagram of a mobile device after completing virtual button setting according to an embodiment.
Figure 7:
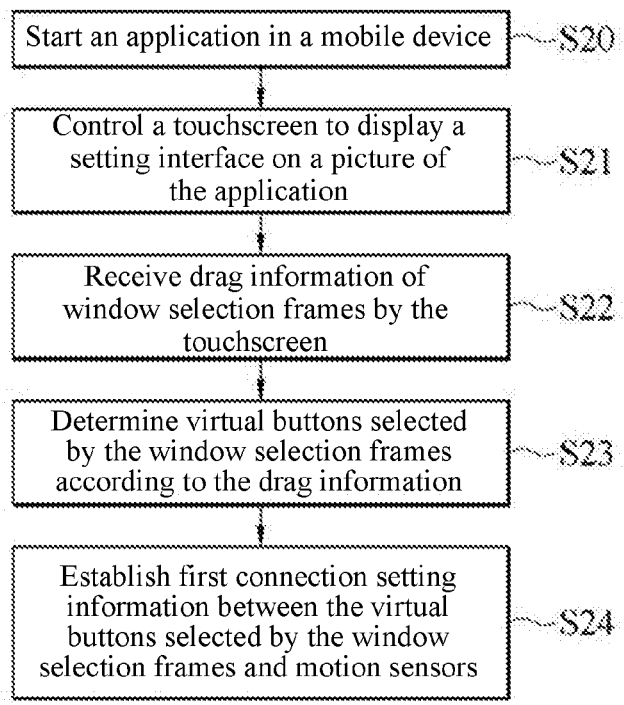
FIG. 7 is a schematic flowchart of setting a virtual button of a mobile device according to another embodiment.
Figure 8:
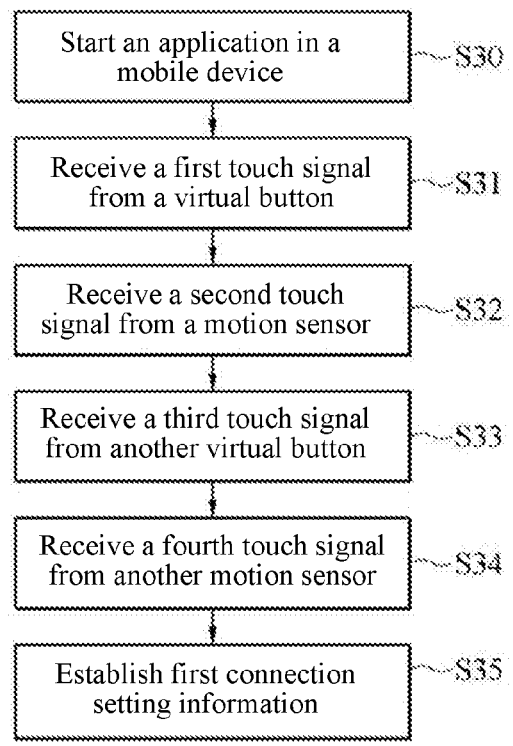
FIG. 8 is a schematic flowchart of setting a virtual button of a mobile device according to still another embodiment.

In some embodiments, as shown in FIG. 1 to FIG. 4, the user starts an application program in the mobile device 10 (as shown in step S10), such as gaming application program. Referring to FIG. 6 at the same time, a picture of the application program is displayed on the touchscreen 16, and two virtual buttons 30 and 32 are displayed on the picture. In this case, the processor 14 controls the touchscreen 16 to display a setting interface on the picture of the application program (as shown in step S11), and the setting interface has two window selection frames 34 and 36. In an embodiment, before performing the setting step, the processor 14 controls the touchscreen 16 to pop up a notice window to ask the user whether to set a shortcut key. When the user selects to set, the setting interface displays two window selection frames 34 and 36 respectively corresponding to the motion sensors 18 and 20 according to the number of the virtual buttons 30 and 32, for setting the left shortcut key A and the right shortcut key B. Next, the positions of the virtual buttons 30 and 32 selected by the window selection frames 34 and 36 are determined (as shown in step S12). Next, the processor 14 establishes first connection setting information between the positions of the virtual buttons 30 and 32 selected by the window selection frames 34 and 36 and the motion sensors 18 and 20 (as shown in step S13), so that the left shortcut key A triggers a function of the virtual button 30 according to the first connection setting information, and the right shortcut key B triggers a function of the virtual button 32 according to the first connection setting information.

Therefore, when the user executes the application program, the user is able to tap the left shortcut key A or the right shortcut key B to trigger the function of the virtual buttons 30 or 32 besides tapping the virtual buttons 30 or 32 of the picture of the application program, for providing users with a better operating hand feeling and environment.

In an embodiment, the setting steps performed by the processor are shown in FIG. 1 to FIG. 3 and FIG. 5 to FIG. 7. A user starts an application program in the mobile device 10 (as shown in step S20), such as gaming application program. A picture of the application is displayed on the touchscreen 16, and the picture is having two virtual buttons 30 and 32 for the user to operate. In this case, the processor 14 controls the touchscreen 16 to display a setting interface on the picture of the application (as shown in step S21), the setting interface has two window selection frames 34 and 36. The setting interface displays the two window selection frames 34 and 36 respectively corresponding to the motion sensors 18 and 20 according to the number of the virtual buttons 30 and 32, or the user sets the number of the window selection frames himself of herself, to set the left shortcut key A and the right shortcut key B. Next, the dragging information of the window selection frames 34 and 36 is received by the touchscreen 16 (as shown in step S22). The virtual buttons 30 and 32 selected by the window selection frames 34 and 36 are determined according to the dragging information (as shown in step S23). In an embodiment, the processor determines whether the window selection frame 34 is dragged onto the virtual button 30 according to the dragging information of the window selection frame 34, and determines whether the window selection frame 36 is dragged onto the virtual button 32 according to the dragging information of the window selection frame 36. If yes, the processor 14 establishes the first connection setting information between the virtual buttons 30 and 32 selected by the window selection frames 34 and 36 and the motion sensors 18 and 20 (as shown in step S24), so that the left shortcut key A triggers the function of the virtual button 30 according to the first connection setting information, and the right shortcut key B triggers the function of the virtual button 32 according to the first connection setting information.

If only one virtual button needs to be set, a setting interface with a window selection frame is displayed on the touchscreen 16, and the number of the window selection frame is adjusted based on actual needs.

In an embodiment, referring to FIG. 1 to FIG. 3 and FIG. 8, the user starts an application program in the mobile device 10 (as shown in step S30), such as gaming application program, a picture of the application program is displayed on the touchscreen 16, and the picture is having two virtual buttons 30 and 32 for the user to operate. When the virtual button 30 needs to be set, the processor 14 receives a first touch signal from the virtual button 30 (as shown in step S31), and then receives a second touch signal from the motion sensor 18 corresponding to the left shortcut button A (as shown in step S32), and the processor 14 sets a connection setting between the virtual button 30 and the motion sensor 18 according to the first touch signal and the second touch signal. When the virtual button 32 needs to be set the processor 14 receives a third touch signal from the virtual button 32 (as shown in step S33), then the processor 14 receives a fourth touch signal from the motion sensor 20 corresponding to the right shortcut key B (as shown in step S34), and the processor 14 sets a connection setting between the virtual button 32 and the motion sensor 20 according to the third touch signal and the fourth touch signal. Finally, the processor 14 establishes first connection setting information according to the connection setting between the virtual button 30 and the motion sensor 18 and the connection setting between the virtual button 32 and the motion sensor 20 as shown in step S35), so that the left shortcut key A triggers the function of the virtual button 30 according to the first connection setting information, and the right shortcut key B triggers the function of the virtual button 32 according to the first connection setting information.

When only one virtual button needs to be set, step S33 and step S34 are omitted, and after the step S31 and step S32 is completed, the first connection setting information is directly generated as shown in step S35.

Please refer to FIG. 1 to FIG. 3 again. After the mobile device completes the button setting process, the processor 14 determines that the left shortcut key A is corresponding to the virtual button 30 according to the first connection setting information when the user taps the left shortcut key A, so that the processor 14 performs the function of the virtual button 30 in the application program. At the same time, the processor 14 controls the vibrator 26 to generate a vibration to feedback the user. Similarly, the processor 14 determines that the right shortcut key B is corresponding to the virtual button 32 according to the first connection setting information when the user taps the right shortcut key B, so that the processor 14 performs the function of the virtual button 32 in the application program. At the same time, the processor 14 controls the vibrator 26 to generate a vibration to feedback the user. in addition, the processor 14 stores the first connection setting information by the storage unit 28, so that the first connection setting information is read when the application program is restarted, and there is no need to re-set the first connection setting information again.

In an embodiment, in the mobile device, a sound feedback is instead of the vibration feedback to feedback the user. In other embodiment, the feedback function can be turn off by users, which depends on usage habits of the user.

Figure 9:
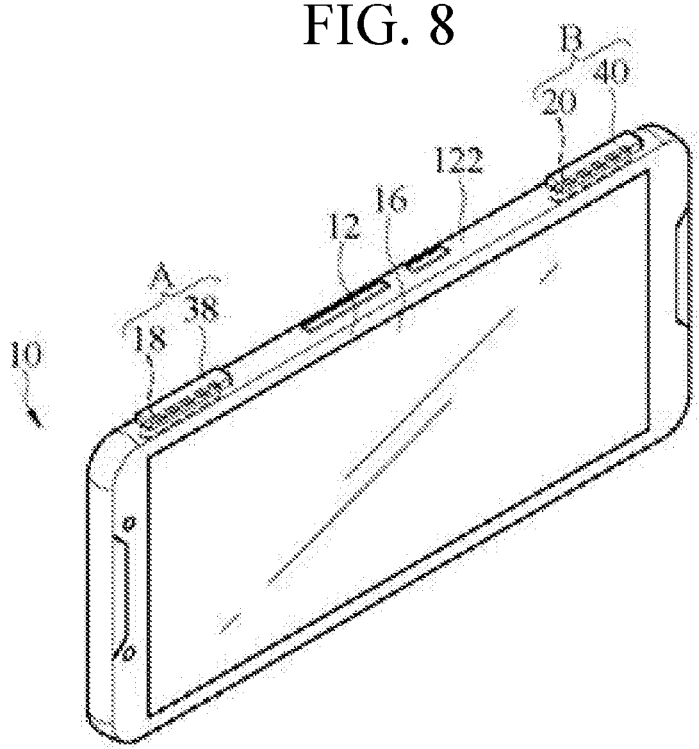
FIG. 9 is a schematic diagram of an appearance of a mobile device according to another embodiment of the disclosure.

FIG. 9 is a schematic diagram of an appearance of the mobile device according to another embodiment of the disclosure. In the embodiment of FIG. 9, because the motion sensors 18 and 20 are respectively disposed in the left side and the right side of one of long edge 122 of the housing 12 and are embedded in the long edge 122 of the housing 12, physical buttons 38 and 40 are respectively disposed at the outer surface of the long edge 122 of the housing 12 corresponding to the motion sensors 18 and 20, for easier operation. The physical buttons 38 and 40 are pressed to trigger the motion sensors 18 and 20 respectively, and the corresponding virtual buttons 30 and 32 are triggered simultaneously according to the first connection setting information. In this embodiment, the physical buttons 38 and 40 are instead of the above-mentioned prompt patterns 22 and 24 respectively, and other functions, effects and settings are the same as those described above, and thus will not be described herein again.

In above embodiments, two motion sensors located on the frame are used to describe a structural relationship and operation of the entire mobile device in detail, and the setting of two virtual buttons is also used as an illustrative embodiment. However, the number and positions of motion sensors and the number and settings of virtual buttons are adjusted based on actual needs.

In some embodiments, the housing further includes a back cover and a frame on the periphery thereof, so that the motion sensors are selectively disposed on the frame, the back cover, or a combination of the frame and the back cover. The positions and the number of motion sensors are adjusted based on actual needs.

Figure 10:
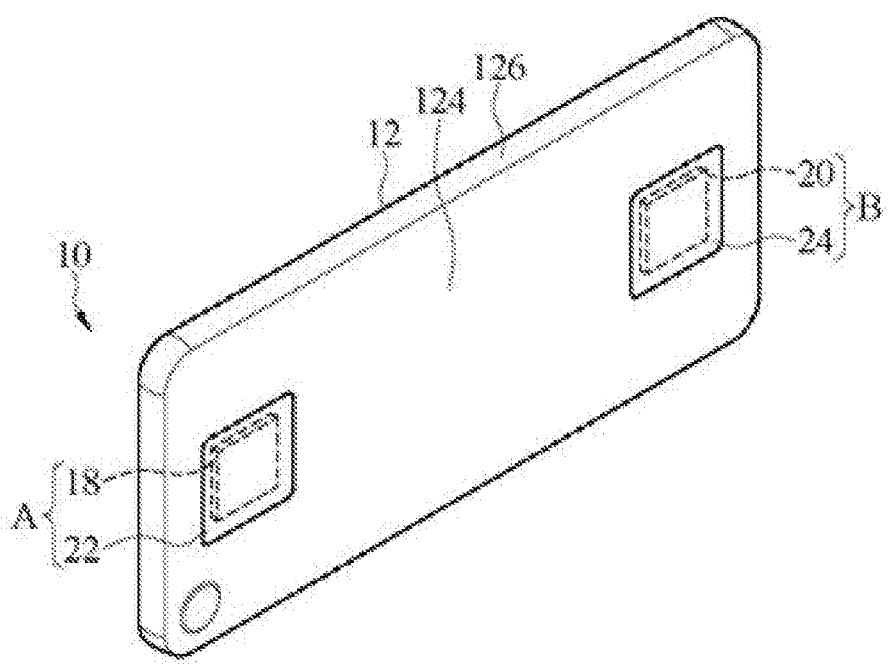
FIG. 10 is a schematic diagram of an appearance of the back of a mobile device according to an embodiment of the disclosure.

Referring to an embodiment shown in FIG. 10, the housing 12 has a back cover 124, a frame 126 on the periphery thereof, and two motion sensors 18 and 20 embedded in the back cover 124. Prompt patterns 22 and 24 are respectively disposed on a surface of the back cover 124 corresponding to the motion sensors 18 and 20 to indicate the positions of the motion sensors 18 and 20, for easy to operate. In this embodiment, the first connection setting information between the motion sensors 18 and 20 disposed on the back cover 124 and the virtual buttons of the application program is also set. The circuit connection relationship and the button setting process are the same as those of the foregoing embodiment, and thus will not be described herein.

In some embodiments, as shown in FIG. 1 to FIG. 2, the motion sensors 18 and 20 sense at least one touch operation, and the processor 14 establishes second connection setting information between the touch operation and a preset operation function of the application program or an operation function defined by user. When the motion sensor 20 senses the touch operation, the processor 14 triggers the corresponding operation function according to the second connection setting information. In an embodiment, the touch operation includes a sliding gesture, a tap gesture, a press gesture or a continuous tap gesture, which respectively represents different functions.

In an embodiment of a browsing operation function, after the processor 14 establishes the second connection setting information between the sliding gesture and the browsing operation function of the application program, the processor 14 triggers the browsing operation function according to the second connection setting information when the motion sensor 20 senses the sliding gesture, and in this case, a picture displayed on the touchscreen 16 of the mobile device 10 is easily browsed through the sliding gesture.

In an embodiment, after the processor 14 establishes the second connection setting information between the sliding gesture and the volume adjust function of the application program, the processor 14 triggers the volume adjust function according to the second connection setting information when the motion sensor 20 senses the sliding gesture. In an embodiment, sliding from left to right is volume up, and sliding from right to left is volume down. In this way, the volume of the mobile device 10 is easily adjusted by the sliding gesture, thereby providing a more convenient operation for the user.

Therefore, the mobile device of the disclosure has a hidden motion sensor connected to a virtual button of an application program, and thus the function of the virtual button of the application program can be triggered by touching the hidden motion sensor, and the displaying surface of the touchscreen is not occupied by user's finder. Since the motion sensors (shortcut keys) and the virtual button all can be operated, the variety of operating selections are provided, In addition, the shortcut keys provide a good operation feeling and a better operation experience for the user.

The above-described embodiments and/or implementations are merely illustrative of preferred embodiments and/or implementations for practicing the techniques of the disclosure, and are not intended to limit the embodiments of the techniques of the disclosure in any manner, and any person skilled in the art may make various variations or modifications to obtain other equivalent embodiments without departing from the scope of the technical means disclosed herein, and all such embodiments should still be considered to be substantially the same techniques or embodiments as the disclosure.

What is claimed is:

1. A mobile device, comprising:
   a housing;
   at least one motion sensor, disposed on the housing;
   a touchscreen, disposed in the housing; and
   a processor, located in the housing and electrically connected with the motion sensor and the touchscreen, when the processor executes at least one application program, the touchscreen displays a setting interface on a picture of the at least one application program, and the processor determines at least on virtual button selected by window selection frames;
   wherein the processor establishes first connection setting information between the motion sensor and the virtual button in the application program displayed on the touchscreen,
   wherein the first connection setting information comprises identifying code of the application program and position information of the virtual button of the application program; and
   the processor executes a function of the virtual button in response to sensing of the motion sensor according to the first connection setting information so that the motion sensor replaces the virtual key to perform the function when the motion sensor is touched.

2. The mobile device according to claim 1, further comprising a vibrator electrically connected with the processor to generate a vibration according to an action of the motion sensor.

3. The mobile device according to claim 1, further comprising a storage unit electrically connected with the processor and configured to store the application program and the first connection setting information.

4. The mobile device according to claim 1, wherein when the motion sensor senses at least one touch operation, the processor executes an operation function according to the touch operation.

5. The mobile device according to claim 4, wherein the touch operation is a sliding gesture, a tap gesture, a press gesture, or a continuous tap gesture.

6. The mobile device according to claim 1, wherein the housing comprises a back cover and a frame on a periphery thereof, so that the motion sensor is selectively disposed on at least one of the frame or the back cover.

7. The mobile device according to claim 1, wherein the motion sensor is embedded in the housing, and a prompt pattern is disposed on an outer surface of the housing corresponding to the motion sensor.

8. The mobile device according to claim 1, wherein the motion sensor is embedded in the housing, and a physical button is disposed on the housing corresponding to the motion sensor.

9. The mobile device according to claim 1, wherein the first connection setting information comprises identifying code of the application program and position information of the virtual button of the application program.

10. The mobile device according to claim 1, wherein the motion sensor is at least one of a capacitive pressure sensor, a resistive pressure sensor, or an ultrasonic sensor.

11. The mobile device according to claim 1, wherein the processor is configured to perform the following setting steps:
    receiving a first touch signal from the virtual button;
    receiving a second touch signal from the motion sensor; and
    setting the first connection setting information between the virtual button and the motion sensor according to the first touch signal and the second touch signal.

12. The mobile device according to claim 1, wherein the processor is configured to
    set the first connection setting information between a virtual button selected by a window selection frame and the motion sensor.

13. The mobile device according to claim 12, wherein the processor is configured to perform the following setting steps:
    receiving dragging information of the window selection frame by the touchscreen; and
    determining the virtual button selected by the window selection frame according to the dragging information.

14. The mobile device according to claim 1, wherein the processor is configured to perform the following setting steps:

setting second connection setting information between the at least one touch operation and a preset operation function of the application program; and performing the operation function according to the second connection setting information when the motion sensor senses the at least one touch operation.

15. A mobile device, comprising:

a housing;

at least one motion sensor, disposed on the housing;

a touchscreen, disposed in the housing; and a processor, located in the housing and electrically connected with the motion sensor and the touchscreen, when the processor executes at least one application program, the touchscreen displays a setting interface on a picture of the at least one application program, and the processor determines at least on virtual button selected by window selection frames;

wherein the processor establishes first connection setting information between the motion sensor and the virtual button in the application program displayed on the touchscreen, wherein the first connection setting information comprises identifying code of the application program and position information of the virtual button of the application program; and the processor executes a function of the virtual button in response to sensing of the motion sensor according to the first connection setting information so that the motion sensor replaces the virtual key to perform the function when the motion sensor is touched;

wherein the function is selectively executed by touching the motion sensor or the virtual button.

* * * * *